(12) United States Patent
Tico et al.

(10) Patent No.: US 12,418,286 B2
(45) Date of Patent: Sep. 16, 2025

(54) RECEIVER CIRCUIT

(71) Applicant: NXP USA, INC., Austin, TX (US)

(72) Inventors: Olivier Tico, St Lys (FR); Pascal Kamel Abouda, Saint Lys (FR); Nicolas Roger Michel Claude Baptistat, Toulouse (FR)

(73) Assignee: NXP USA, Inc., Austin, TX (US)

( * ) Notice: Subject to any disclaimer, the term of this patent is extended or adjusted under 35 U.S.C. 154(b) by 103 days.

(21) Appl. No.: 18/451,212

(22) Filed: Aug. 17, 2023

(65) Prior Publication Data

US 2024/0072794 A1 Feb. 29, 2024

(30) Foreign Application Priority Data

Aug. 25, 2022 (EP) ...................... 22306256

(51) Int. Cl.
*H03K 17/687* (2006.01)
*H03K 17/06* (2006.01)
*H03K 17/10* (2006.01)

(52) U.S. Cl.
CPC ......... *H03K 17/687* (2013.01); *H03K 17/063* (2013.01); *H03K 17/102* (2013.01)

(58) Field of Classification Search
None
See application file for complete search history.

(56) References Cited

U.S. PATENT DOCUMENTS

| | | |
|---|---|---|
| 4,529,947 A | 7/1985 | Biard et al. |
| 5,929,434 A | 7/1999 | Kozlowski et al. |
| 6,696,887 B2 | 2/2004 | Taubman et al. |
| 8,421,016 B2 * | 4/2013 | Audier .................. H04N 25/00 250/338.4 |
| 2011/0180692 A1 | 7/2011 | Matsuda et al. |
| 2014/0027640 A1 * | 1/2014 | Yang ................. H01L 27/14609 257/229 |

* cited by examiner

*Primary Examiner* — Kenneth B Wells

(57) ABSTRACT

A receiver circuit comprising: an input-pin; a receiver-input-node; a ground-pin; an internal-node that is connected to the input-pin; and a MOSFET. The MOSFET has a conduction channel connected in series between the internal-node and the receiver-input-terminal; and a gate terminal, the voltage at which sets the conductivity of the conduction channel. The receiver circuit also includes an amplifier that: has an input terminal that is connected to the internal-node; and provides a voltage control signal to the gate terminal of the MOSFET such that the voltage at the internal-node with respect to the ground-pin is constant.

20 Claims, 10 Drawing Sheets

(AS AMENDED)

RECEIVER CIRCUIT

CROSS-REFERENCE TO RELATED APPLICATIONS

This application claims the priority under 35 U.S.C. § 119 of European Patent application no. 22306256.3, filed on 25 Aug. 2022, the contents of which are incorporated by reference herein.

FIELD

The present disclosure relates to receiver circuits, and in particular to receiver circuits for processing infrared signals received at a photo-diode.

SUMMARY

According to a first aspect of the present disclosure there is provided a receiver circuit comprising:
an input-pin;
a receiver-input-node;
a ground-pin;
an internal-node that is connected to the input-pin;
a MOSFET having:
  a conduction channel connected in series between the internal-node and the receiver-input-node; and
  a gate terminal, the voltage at which sets the conductivity of the conduction channel; and
an amplifier that:
  has an input terminal that is connected to the internal-node; and
  provides a voltage control signal to the gate terminal of the MOSFET such that the voltage at the internal-node with respect to the ground-pin is constant.

Advantageously, the MOSFET and the amplifier can improve the performance of the receiver circuit with respect to ground noise injection.

In one or more embodiments, the MOSFET is a PMOS MOSFET.

In one or more embodiments, the MOSFET is an NMOS MOSFET.

In one or more embodiments, the receiver circuit may further include a reference-voltage-source that is configured to provide a reference voltage to another input terminal of the amplifier.

In one or more embodiments:
the receiver circuit includes a first-ground-pin and a second-ground-pin;
the receiver circuit is configured to process a signal at the receiver-input-node with respect to a voltage on the first-ground-pin; and
the reference-voltage-source is provided with respect to a voltage on the second-ground-pin.

In one or more embodiments:
the receiver circuit is configured to process a signal at the receiver-input-node with respect to a voltage on the ground-pin; and
the reference-voltage-source is provided with respect to a voltage on the ground-pin.

In one or more embodiments, the receiver circuit further comprises:
a first-current-source connected between a supply-voltage-terminal and one end of the conduction channel of the MOSFET; and
a second-current-source connected between a ground-pin and the other end of the conduction channel of the MOSFET.

In one or more embodiments:
the first-current-source is connected between the supply-voltage-terminal and the source of the MOSFET; and
the second-current-source is connected between the ground-pin and the drain of the MOSFET.

In one or more embodiments, the internal-node is galvanically connected to the input-pin by a bond wire.

In one or more embodiments, the input-pin is configured to receive a current signal from a sensor.

In one or more embodiments, the sensor comprises a photo-diode.

According to a further aspect of the present disclosure, there is provided an integrated circuit comprising any receiver circuit disclosed herein.

According to a further aspect of the present disclosure, there is provided a system comprising:
any receiver circuit disclosed herein provided on an integrated circuit; and
a sensor, which is external to the integrated circuit, wherein the sensor is configured to provide a current signal to the input-pin of the receiver circuit.

In one or more embodiments, the sensor comprises a photo-diode.

In one or more embodiments, the system is a battery management system.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
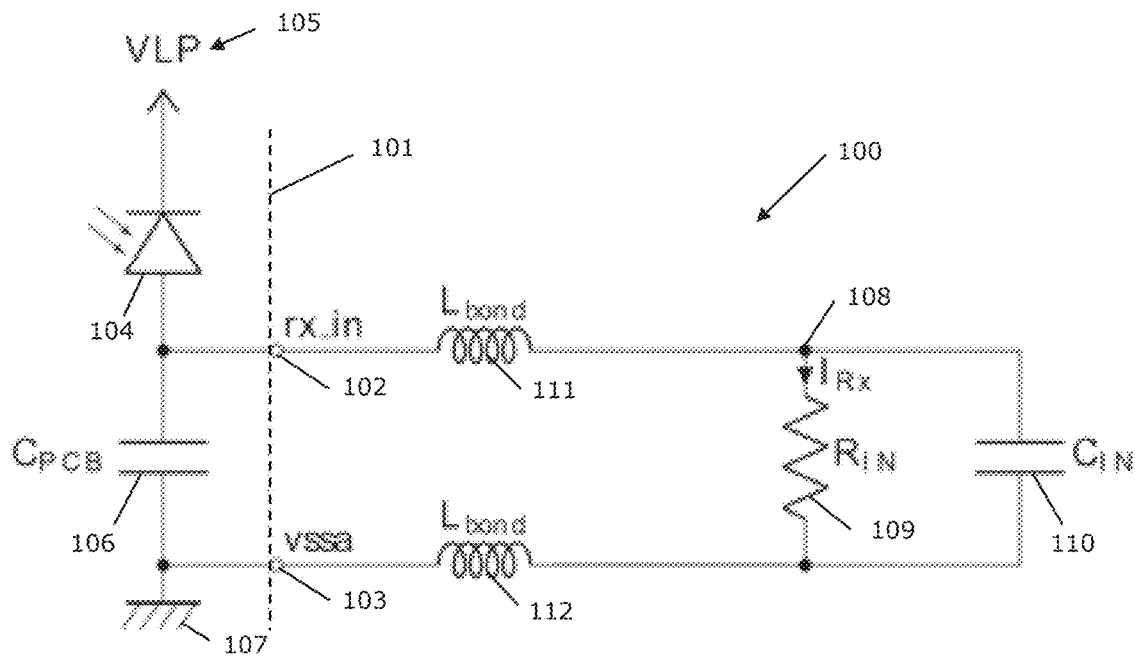
FIG. 1 shows an example of a receiver circuit.

FIG. 1 shows an example of a receiver circuit 100. In this example, the receiver circuit is provided on an integrated circuit (IC), a boundary of which is shown with a dashed line 101 in FIG. 1. Two of the pins of the IC are shown in FIG. 1: an input-pin, rx_in, 102 and a ground-pin, vssa, 103.

The receiver circuit 100 is for an infra red (IR) communication system, in this example an IR communication system for a battery management system (BMS). Such an IR communication system may be a serial IR system. A photo-diode 104 is shown connected to the input-pin, rx_in, 102. The photo-diode 104 receives an IR communication signal from a corresponding IR transmitter. The photo-diode 104 is connected to a low power voltage source (VLP) 105.

Also shown in FIG. 1 is a capacitance, $C_{PCB}$, 106 connected in series between the input-pin, rx_in, 102 and a printed circuit board (PCB) ground 107. The ground-pin, vssa, 103 of the IC is also connected to the PCB ground 107. This capacitance, $C_{PCB}$, 106 represents the parasitic capacitance of the PCB to which the IC is connected.

Returning now to the receiver circuit 100 on the IC, a receiver-input-node 108 is indicated in the figure. The inductance of a bond wire, $L_{bond}$, 111 is shown connected between the input-pin, rx_in, 102 and the receiver-input-node 108. An input-resistor 109, $R_{IN}$, and an input-capacitor, $C_{IN}$, 110 are shown connected in parallel between the receiver-input-node 108 and the ground-pin, vssa, 103 (via another bond wire, $L_{bond}$, 112). The input-resistor 109, $R_{IN}$, and the input-capacitor, $C_{IN}$, 110 are included to represent the input impedance of the receiver. Although not shown in FIG. 1, it will be appreciated that the receiver circuit 100 includes additional components for providing a receiver-output-signal, rx_out.

In practice, ground noise is generated inside the integrated circuit due to transient current consumption flowing through the bond wires, $L_{bond}$, 111, 112. Current consumption can come from blocks sharing the same ground.

Figure 2:
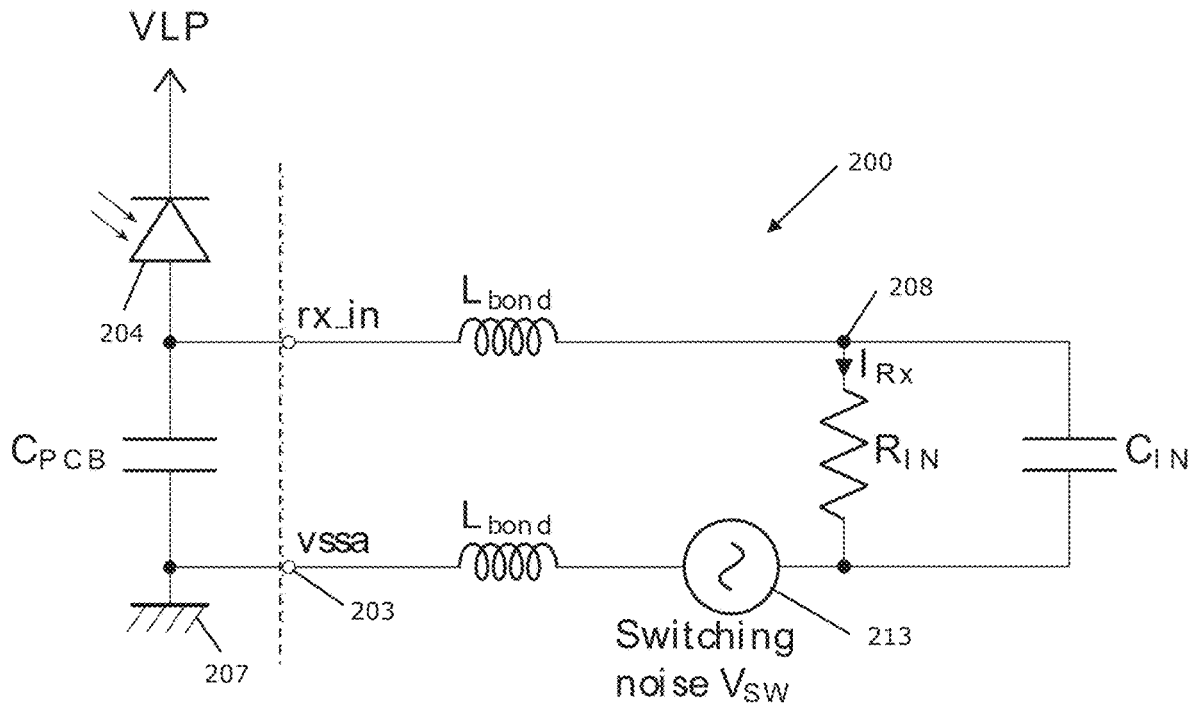
FIG. 2 shows the receiver circuit of FIG. 1 that will be used to describe the effects of ground noise.

FIG. 2 shows the receiver circuit of FIG. 1 that will be used to describe the effects of such ground noise. Features of FIG. 2 that have already been described with reference to FIG. 1 have been given corresponding reference numbers in the 200 series and will not necessarily be described again here.

In FIG. 2, a switching noise voltage source, $V_{SW}$, 213 is shown to model a perturbation induced by other operating blocks (with conducted current or substrate noise injection (SNI)) sharing the same ground. The ground noise that is identified above, and that is modelled in FIG. 2 as the switching noise voltage source, $V_{SW}$, 213, can generate tens of mV of noise with respect to PCB ground 207 on the local IC grounds (ground-pin, vssa, 203 in FIG. 2). Therefore, the voltage at the receiver-input-node 208 with respect to PCB ground 207 is modulated by this same ground noise level. In a system that is based on current detection (current mode communication) and where the receiver input stage is low impedance (such as the IR communication system of FIG. 2), the ground noise can be "seen" by the receiver at the receiver-input-node 208 as an input signal depending on its amplitude and frequency. Therefore, this unintended input current signal at the receiver-input-node 208 can generate an unintended (and undesirable) receiver output signal, rx_out, which can prevent the receiver from properly decoding the expected input signal that is provided by the photo-diode 204 (or any other external sensor, depending upon the communication system).

One way to address this issue is for the receiver 200 to be grounded with a dedicated ground bonding. This would overcome any shared ground noise. However, this would be at a cost of an additional ESD (electrostatic discharge) protection and an additional package pin. This is because sharing the same package pin with several bondings will not prevent ground noise due to mutual bonding inductance.

Figure 3A:
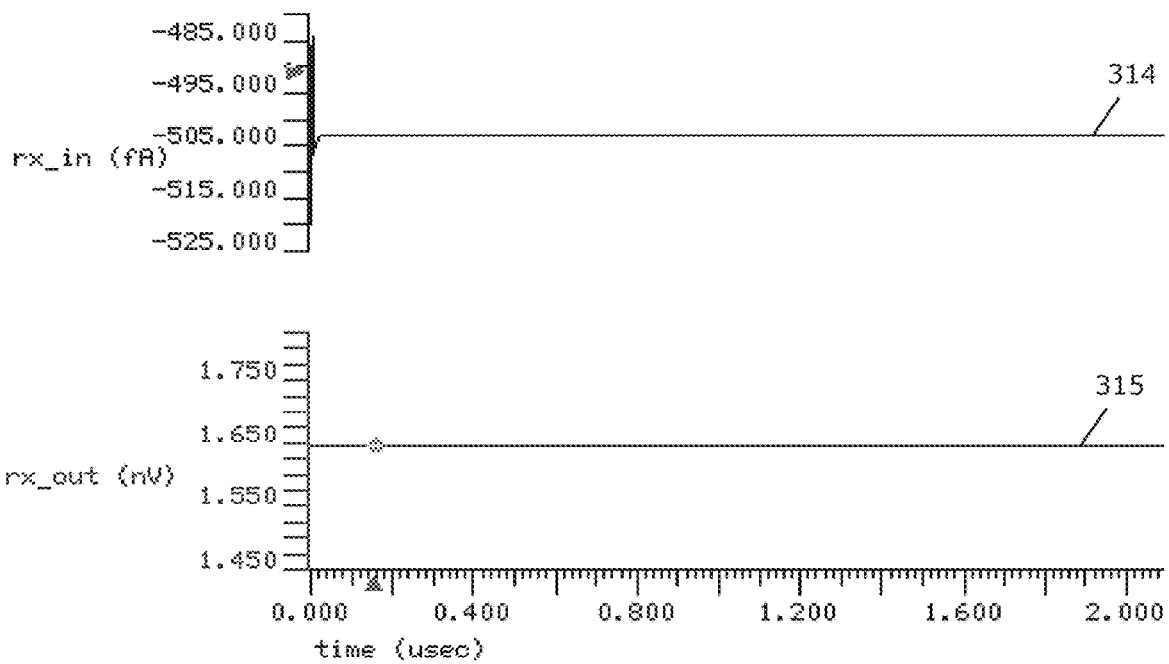
FIGS. 3a and 3b illustrate simulation results for the receiver of FIG. 1.
Figure 3B:
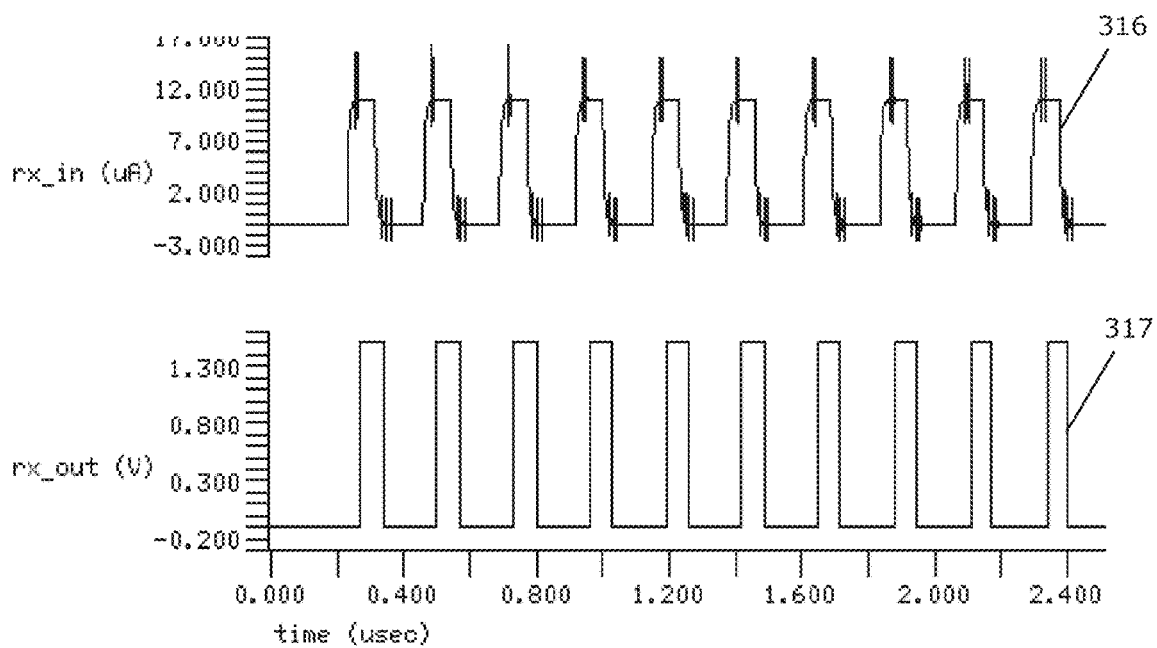

FIGS. 3*a* and 3*b* illustrate simulation results for the receiver of FIG. 1; that is, one that doesn't have any noise.

FIG. 3*a* shows a simulation when there is no communication (that is, the photo-diode that is shown in FIG. 1 does not receive an IR communication signal). The upper plot of FIG. 3*a* shows the current 314 at the input-pin, rx_in. The lower plot of FIG. 3*a* shows the voltage 315 of the receiver-output-signal, rx_out. As expected, there is no noise present in either of the plots of FIG. 3*a*.

FIG. 3*b* shows a simulation when there is high speed communication (that is, the photo-diode that is shown in FIG. 1 receives an IR communication signal). As with FIG. 3*a*: the upper plot of FIG. 3*b* shows the current 316 at the input-pin, rx_in; and the lower plot of FIG. 3*b* shows the voltage 317 of the receiver-output-signal, rx_out. Again, as expected, there is no noise present in either of the plots of FIG. 3*b*. The receiver-output-signal, rx_out, 317 provides a good representation of the input-signal that is provided by the photo-diode.

Figure 4A:
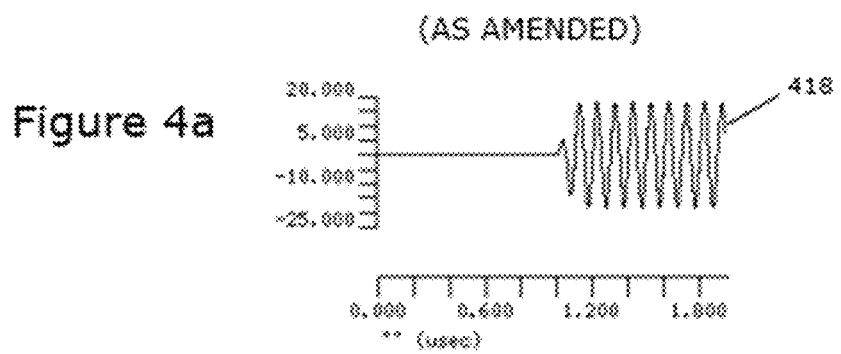
FIGS. 4a, 4b and 4c illustrate simulation results for the receiver of FIG. 2.
Figure 4B:
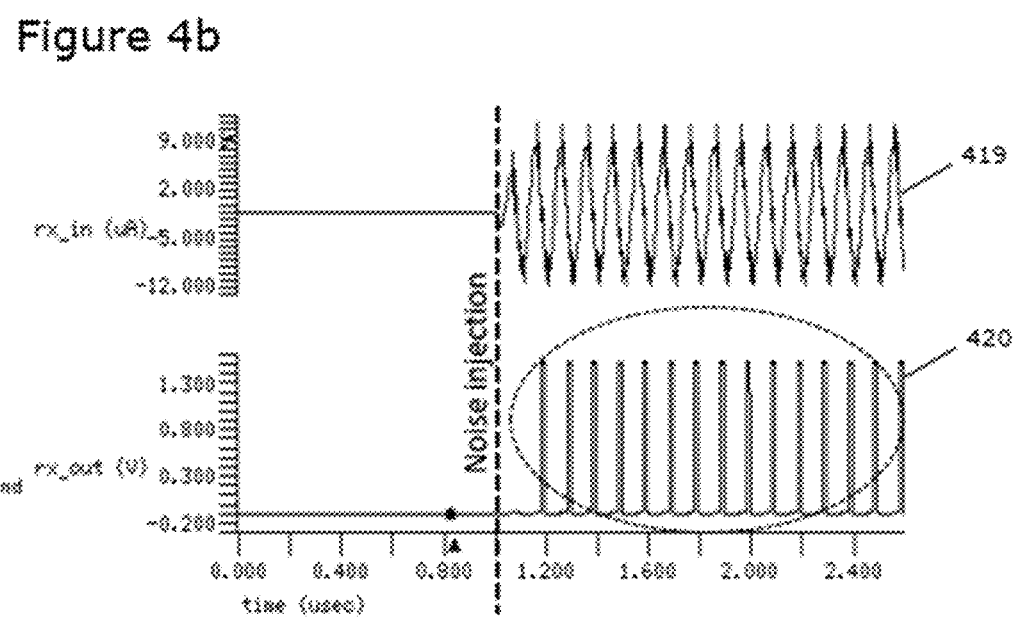
Figure 4C:
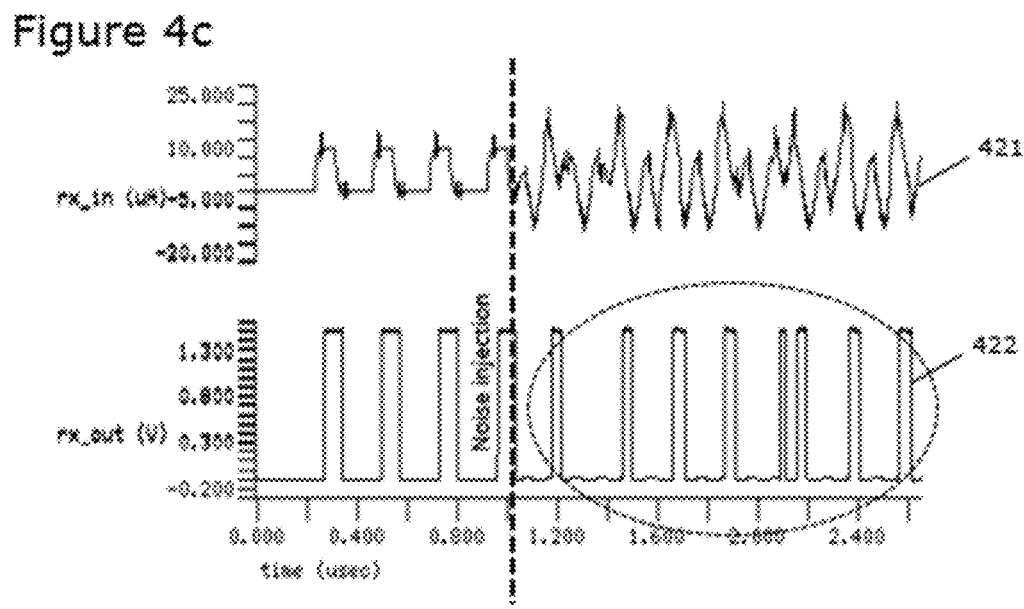

FIGS. 4*a*, 4*b* and 4*c* illustrate simulation results for the receiver of FIG. 2; that is, one that has the switching noise modelled by a switching noise voltage source, $V_{SW}$.

FIG. 4*a* shows a simulation of the voltage provided by the switching noise voltage source, $V_{SW}$, 418 which in this example has a value of 36 mVpp (millivolts, peak to peak amplitude). As can be seen from FIG. 4*a*, the noise is injected after 1 μs.

FIG. 4*b* shows a simulation when there is no communication (that is, the photo-diode that is shown in FIG. 2 does not receive an IR communication signal). The upper plot of FIG. 4*b* shows the current 419 at the input-pin, rx_in. The lower plot of FIG. 4*b* shows the voltage 420 of the receiver-output-signal, rx_out. As can be seen from FIG. 4*b*, the noise injected after 1 μs is processed by the receiver such that it translates into a receiver-output-signal, rx_out, 420 that incorrectly indicates that communication data has been received by the photo-diode. That is, when Rx_in is perturbated by switching noise when there is no communication, the receiver is affected such that it outputs the wrong message.

FIG. 4*c* shows a simulation when there is high speed communication (that is, the photo-diode that is shown in FIG. 2 receives an IR communication signal). As with FIG. 4*b*: the upper plot of FIG. 4*c* shows the current 421 at the input-pin, rx_in; and the lower plot of FIG. 4*c* shows the voltage 422 of the receiver-output-signal, rx_out. As can be seen from FIG. 4*c*, the noise injected after 1 us degrades the quality of the receiver-output-signal, rx_out, 422. That is, when Rx_in is perturbated by switching noise when there is communication, the receiver is also affected such that it outputs the wrong message.

Examples of the present disclosure, that will be described below, can significantly improve high-speed current mode communication and the impact of receiver ground noise on the sensitivity of the receiver. Such examples can improve immunity from this noise, which is equivalent to an input current signal in current mode communication, especially where the receiver input stage is low impedance. Due to this noise immunity improvement, a receiver detection threshold can then be set to a lower current level and therefore can allow communication over longer distances between an emitter and the receiver (e.g. infrared communication with photo-diodes).

Figure 5:
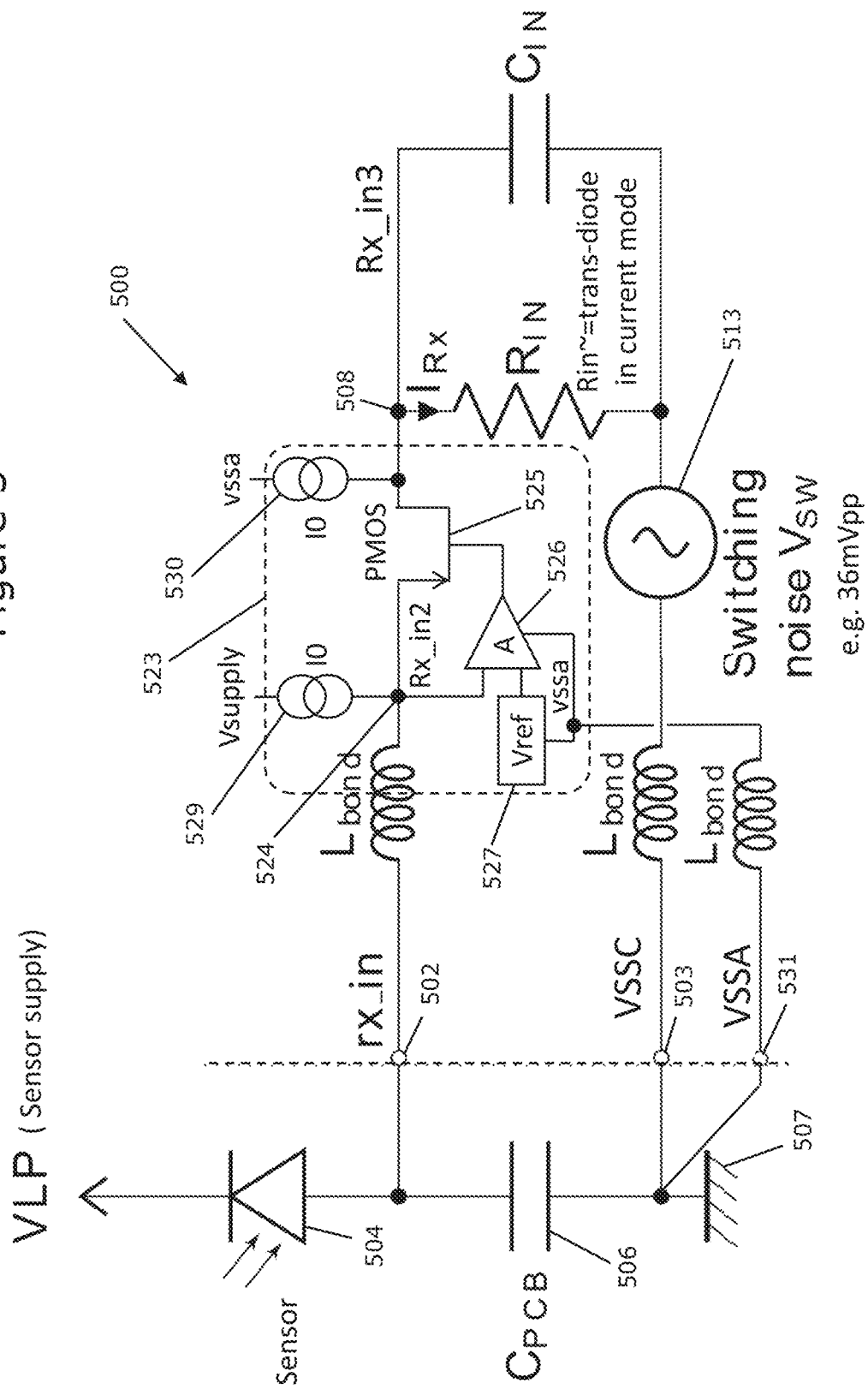
FIG. 5 illustrates an example embodiment of a receiver circuit 500 according to the present disclosure.

FIG. 5 illustrates an example embodiment of a receiver circuit 500 according to the present disclosure. Features of FIG. 5 that are also illustrated in an earlier drawing are given corresponding reference numbers in the 500 series and will not necessarily be described again here.

The receiver circuit 500 has an input-pin, rx_in, 502 and a receiver-input-node, Rx_in3, 508 that are the same way as those described with reference to FIGS. 1 and 2.

In the example of FIG. 5 the IC that includes the receiver circuit 500 has two ground pins: a first-ground-pin, VSSC, 503 and a second-ground-pin, VSSA, 531. The first-ground-pin, VSSC, 503 is a reference pin for communication blocks in the IC, including the receiver circuit 500. The second-ground-pin, VSSA, 531 is a reference pin for other blocks in the IC. Providing two separate ground-pins 503, 531 in this way can beneficially reduce the ground noise that is experienced at the ground-pin (VSSC, 503) for the receiver circuit 500. Nonetheless, as will be discussed below with reference to FIG. 9, in other examples the IC may have only one ground-pin.

In this example, the receiver circuit 500 also includes an internal-node, Rx_in2, 524 that is connected to the input-pin, rx_in, 502. In FIG. 5 the internal-node, Rx_in2, 524 is galvanically connected to the input-pin, rx_in, 502. However, in other examples the package may not require bond wires and therefore the internal-node, Rx_in2, 524 does not necessarily need to be galvanically connected to the input-pin, rx_in, 502.

As will be discussed below, the receiver circuit includes additional components (when compared with FIG. 1), that are shown in box 523 in FIG. 5, such that the internal-node, Rx_in2, 524 is a low impedance node that is connected to the sensor output (that is, the input-pin, rx_in, 502 of the IC that receives the output signal from the sensor—in this example the photo-diode 504). As will be explained below, and as illustrated by way of simulation results, the internal-node, Rx_in2, 524 is not modulated by the switching noise voltage source, $V_{SW}$, 513.

Figure 8:
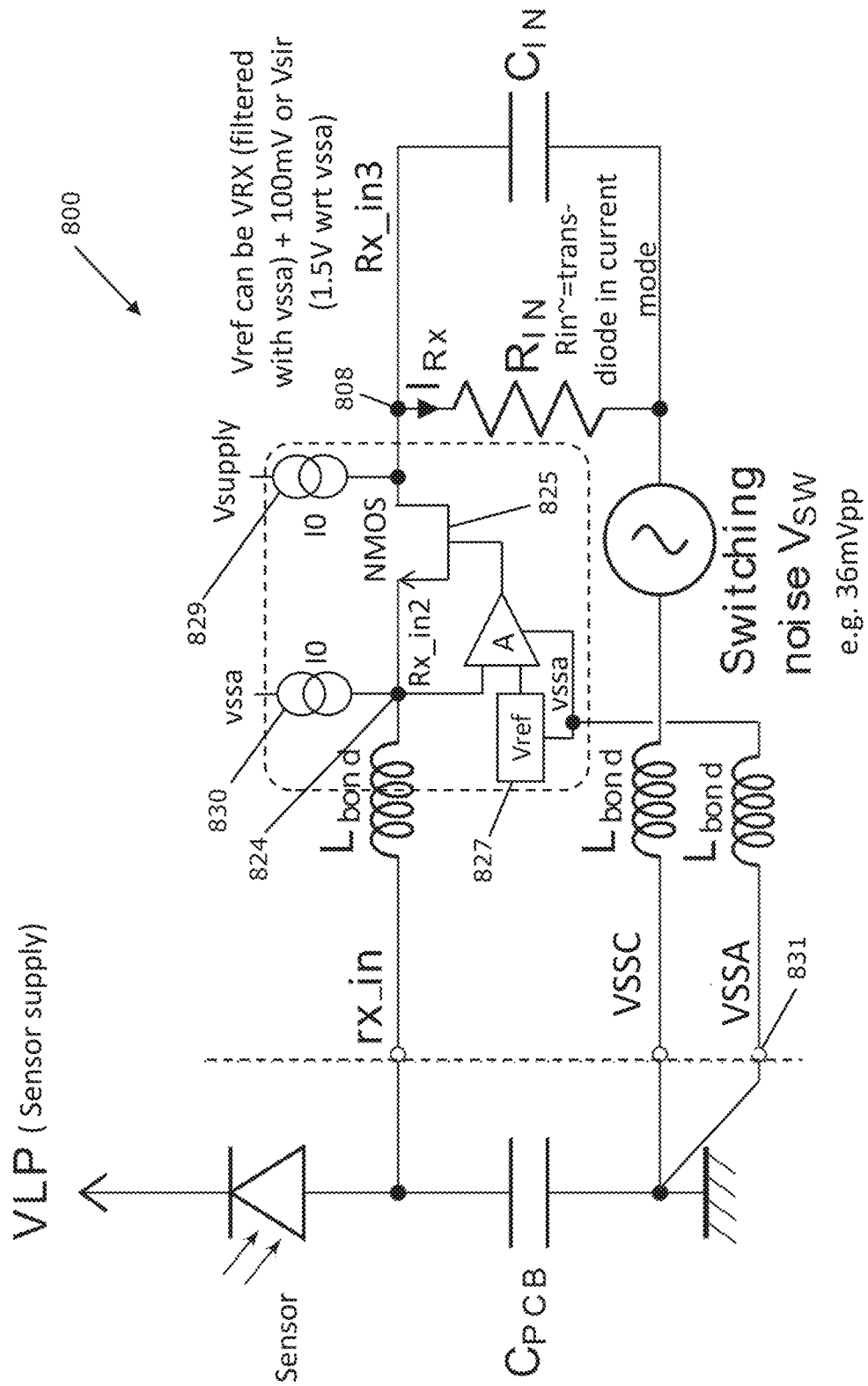
FIG. 8 illustrates another example embodiment of a receiver circuit according to the present disclosure.

The additional components 523 include a metal-oxide-semiconductor field-effect transistor (MOSFET). In FIG. 5 a PMOS MOSFET 525 is shown. FIG. 8 illustrates how an NMOS MOSFET can be used instead.

Returning to FIG. 5, the PMOS MOSFET 525 has a conduction channel (between its source and its drain, as it known in the art) that is connected in series between the internal-node, Rx_in2, 524 and the receiver-input-node, Rx_in3, 508. The PMOS MOSFET 525 also has a gate terminal, the voltage at which sets the conductivity of the conduction channel.

The additional components 523 in this example also include an amplifier 526. The amplifier 526 has an input terminal that is connected to the internal-node, Rx_in2, 524. The amplifier 526 has an output terminal that provides a voltage control signal to the gate terminal of the PMOS MOSFET 525 such that the voltage at the internal-node, Rx_in2, 524 with respect to the first-ground-pin, VSSC, 503 is constant. In this way, any "ground" switching noise voltage will not cause a significant current to be received at the input-pin, rx_in, 502 from the parasitic capacitance, $C_{PCB}$, 506.

In the example of FIG. 5, the additional components 523 also include: a reference-voltage-source 527, a first-current-source, I0, 529 and a second-current-source, I0, 530.

The reference-voltage-source 527 provides a voltage of Vref to another input terminal of the amplifier 526. As shown in FIG. 5, in this example, the reference-voltage-source 527 is provided with respect to the voltage on the second-ground-pin, VSSA, 531. Whereas, the receiver circuit 500 is configured to process a signal at the receiver-input-node 508 with respect to a voltage on the first-ground-pin, VSSC, 503. The value of Vref can be Vsir, where Vsir is the voltage provided by a serial infrared power supply. Vsir can be 1.5V with respect to vssa, in some examples. The specific value of Vref does not affect the functionality of the receiver circuit 500, as long as Vref is larger than rx_in3 voltage (receiver input voltage). This is important for guaranteeing that the PMOS MOSFET 525 (pass device) has more than 100-200 mV drop out voltage (VDS).

The first-current-source, I0, 529 is connected between a supply-voltage-terminal, Vsupply, and the internal-node, Rx_in2, 524. Therefore, the first-current-source, I0, 529 provides a current to one end of the conduction channel of the PMOS MOSFET 525 (the source of the PMOS MOSFET 525 in FIG. 5). The second-current-source, I0, 530 is connected between a ground-pin (in this example the second-ground-pin, VSSA, 531) and the receiver-input-node, Rx_in3, 508. Therefore, the second-current-source, I0, 530 provides a current to the other end of the conduction channel of the PMOS MOSFET 525 (the drain of the PMOS MOSFET 525 in FIG. 5). The first-current-source, I0, 529 and the second-current-source, I0, 530 are provided to ensure that the PMOS MOSFET 525 is correctly biased, even when the photo-diode 504 does not receive any IR light and therefore does not provide a sensed current signal, such that the PMOS MOSFET 525 is always active and can be appropriately operated such that the current through its conduction channel can be controlled.

The additional components 523 create a new low impedance node (the internal-node, Rx_in2, 524) that is connected to the sensor output (via the input-pin, rx_in, 502) and referenced to a noise free ground (the second-ground-pin, VSSA, 531) while the receiver ground is connected to the communication ground (the first-ground-pin, VSSC, 503) which can be noisy due to current consumption of other communication blocks that are also connected to the same ground. As will be shown in the following simulation results, the voltage at the input-pin, rx_in, 502 with respect to pcb_ground 507 is still noisy but it does not generate a current input signal at the receiver output because the drain impedance of the PMOS MOSFET 525 is high enough to avoid or reduce current coupling.

Figure 6A:
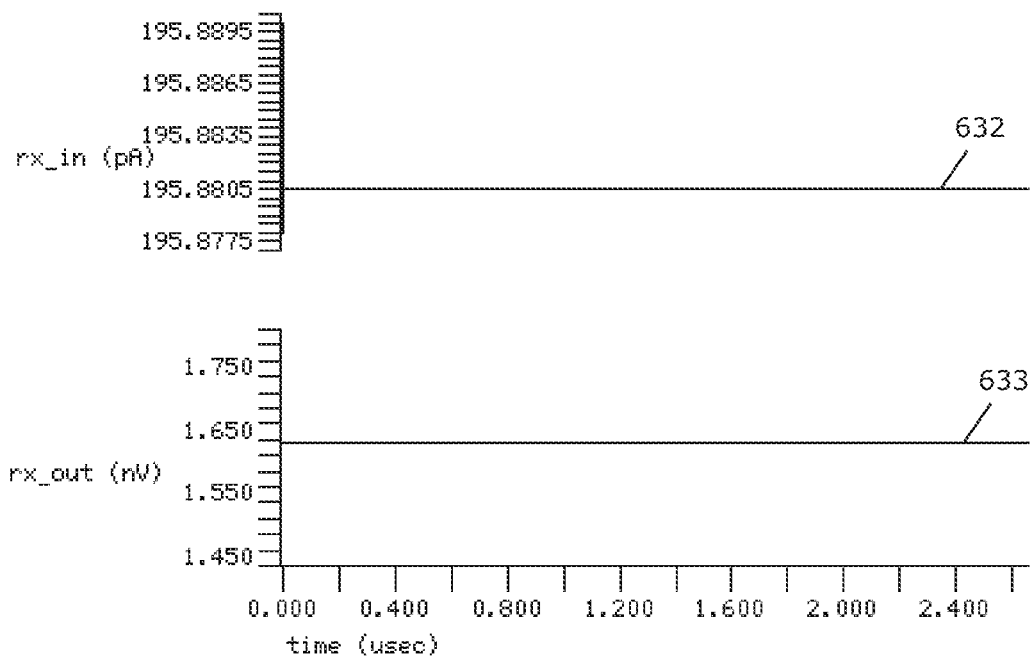
FIGS. 6a and 6b illustrate simulation results for the receiver circuit of FIG. 5, but without the switching noise voltage source, $V_{SW}$.
Figure 6B:
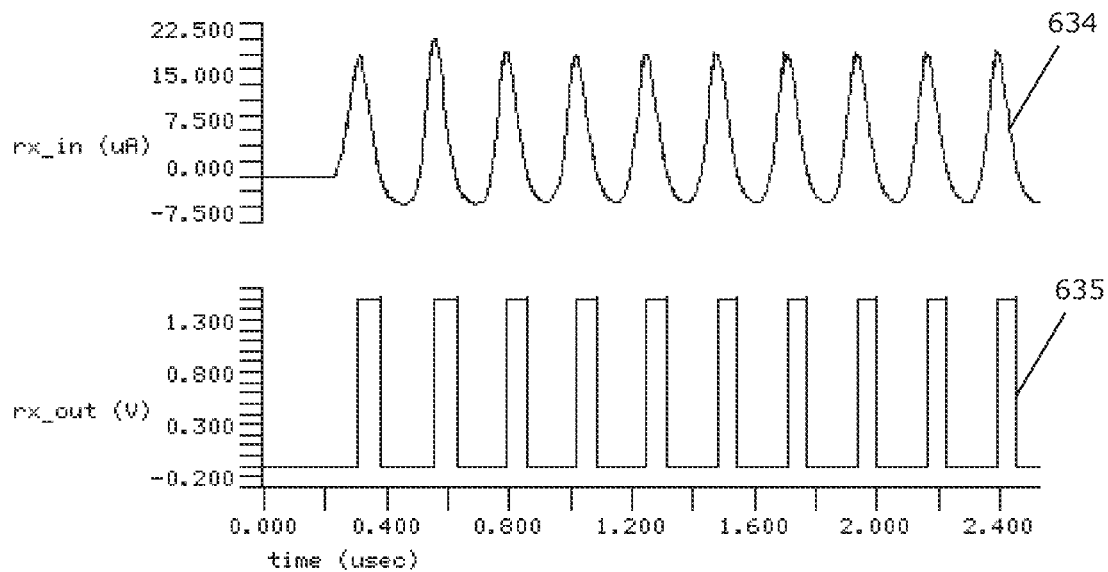
Figure 7A:
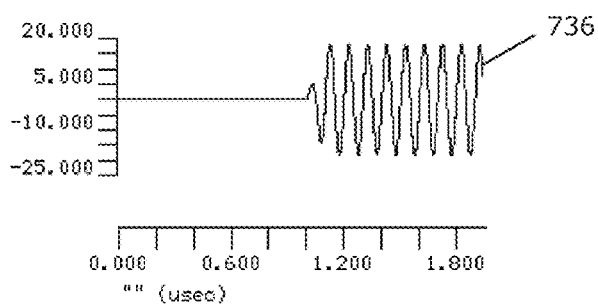
FIGS. 7a, 7b and 7c illustrate simulation results for the receiver circuit of FIG. 5 with the switching noise voltage source, $V_{SW}$.
Figure 7B:
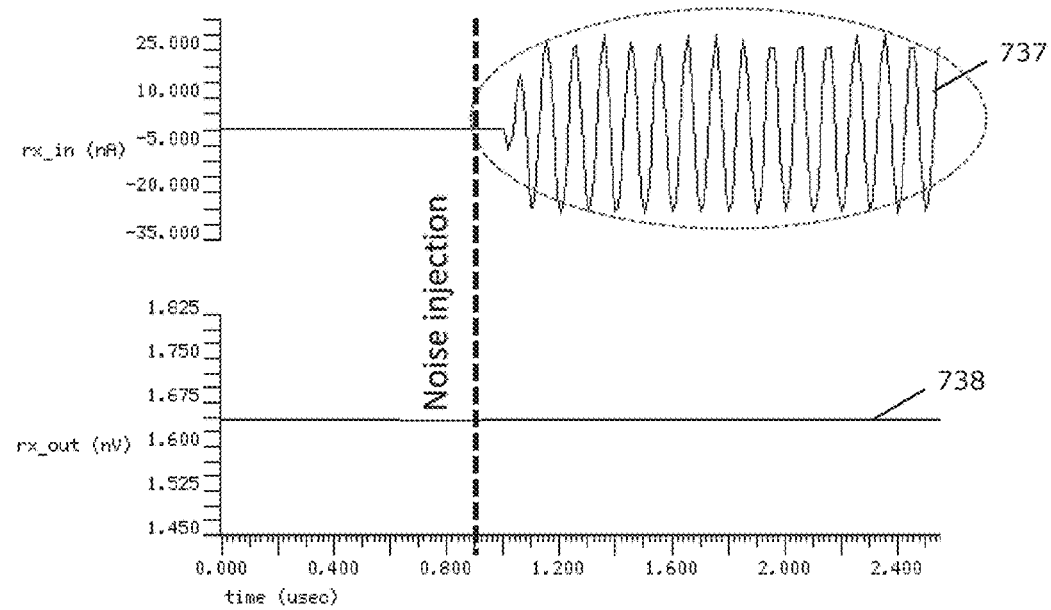
Figure 7C:
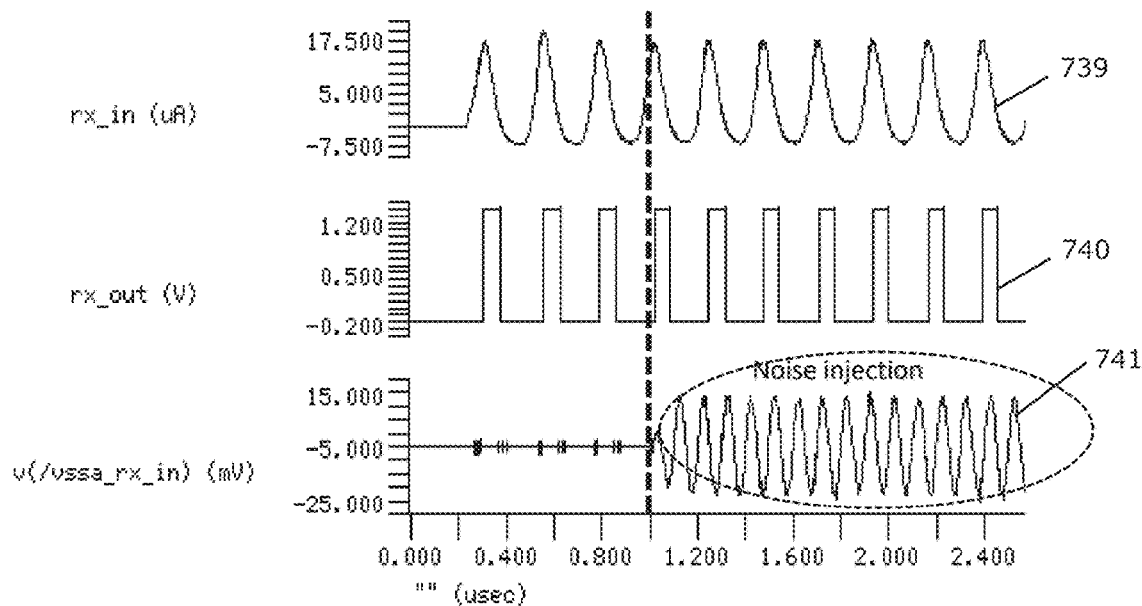

FIGS. 6a and 6b illustrate simulation results for the receiver circuit of FIG. 5, but without the switching noise voltage source, $V_{SW}$. FIGS. 7a, 7b and 7c illustrate simulation results for the receiver circuit of FIG. 5 with the switching noise voltage source, $V_{SW}$.

FIG. 6a shows a simulation when there is no communication (that is, the photo-diode that is shown in FIG. 5 does not receive an IR communication signal). The upper plot of FIG. 6a shows the current 632 at the input-pin, rx_in. The lower plot of FIG. 6a shows the voltage 633 of the receiver-output-signal, rx_out. As expected, there is no noise present in either of the plots of FIG. 6a. Also, by comparing the lower plot of FIG. 6a with the corresponding lower plot of FIG. 3a, it can be seen that the inclusion of the additional components of FIG. 5 does not affect the voltage 633 of the receiver-output-signal, rx_out.

FIG. 6b shows a simulation when there is high speed communication (that is, the photo-diode that is shown in FIG. 5 receives an IR communication signal). As with FIG. 6a: the upper plot of FIG. 6b shows the current 634 at the input-pin, rx_in; and the lower plot of FIG. 6b shows the voltage 635 of the receiver-output-signal, rx_out. By comparing the plots of FIG. 6b with the corresponding plots of FIG. 3b, it can be seen that the inclusion of the additional components of FIG. 5 cause the current 634 at the input-pin, rx_in, to have a slightly different shape but that the receiver-output-signal, rx_out, 635 is unaffected. That is, the inclusion of the additional components in FIG. does not degrade the performance of the receiver circuit when there is no noise present.

Turning now to FIGS. 7a, 7b and 7c, FIG. 7a shows a simulation of the voltage provided by the switching noise voltage source, $V_{SW}$, 736. In the same way as FIG. 4a, the noise in FIG. 7a is injected after 1 µs (purely as an example).

FIG. 7b shows a simulation when there is no communication (that is, the photo-diode that is shown in FIG. 5 does not receive an IR communication signal). The upper plot of FIG. 7b shows the current 737 at the input-pin, rx_in, which includes the noise that is injected by the switching noise voltage source, $V_{SW}$, 736. The lower plot of FIG. 7b shows the voltage 738 of the receiver-output-signal, rx_out. As can be seen from FIG. 7b, the noise injected is not present in the receiver-output-signal, rx_out, 738. That is, despite the rx_in perturbation due to switching noise when there is no communication, there is no impact on rx_out. Therefore, advantageously the additional components of FIG. 5 have improved the performance of the receiver circuit with respect to ground noise injection.

FIG. 7c shows a simulation when there is high speed communication (that is, the photo-diode that is shown in FIG. 5 receives an IR communication signal). The upper plot of FIG. 7c shows the current 739 at the input-pin, rx_in; the middle plot of FIG. 7c shows the voltage 740 of the receiver-output-signal, rx_out; and the lower plot of FIG. 7c shows the voltage at the node in the circuit where the noise is injected. The lower plot in FIG. 7c is included to show that there is indeed noise in the system, even though it is not visible in the receiver-output-signal, rx_out, 740.

As can be seen from FIG. 7c, the noise injected after 1 µs does not degrade the quality of the signal at the input-pin, rx_in, 739 or the receiver-output-signal, rx_out, 740. Since no switching noise is visible on rx_in current, the receiver circuit can correctly generate the message communication (rx_out).

FIG. 8 illustrates another example embodiment of a receiver circuit 800 according to the present disclosure. The receiver circuit of FIG. 8 is very similar to the one of FIG. 5.

In FIG. 8, an NMOS MOSFET 825 is used instead of the PMOS MOSFET of FIG. 5. Also, the first-current-source, I0, 829 and the second-current-source, I0, 830 are reversed in order to provide the correct biasing for the NMOS MOSFET 825. Therefore, the first-current-source, I0, 829 is connected between a supply-voltage-terminal, Vsupply, and the receiver-input-node, Rx_in3, 808. In this way, the first-current-source, I0, 829 provides a current to one end of the conduction channel of the NMOS MOSFET 825 (the drain of the NMOS MOSFET 825 in FIG. 8). The second-current-source, I0, 830 is connected between a ground-pin (in this example the second-ground-pin, VSSA, 831 and the internal-node, Rx_in2, 824. Therefore, the second-current-source, I0, 830 provides a current to the other end of the conduction channel of the NMOS MOSFET 825 (the source of the NMOS MOSFET 825 in FIG. 8).

Figure 9:
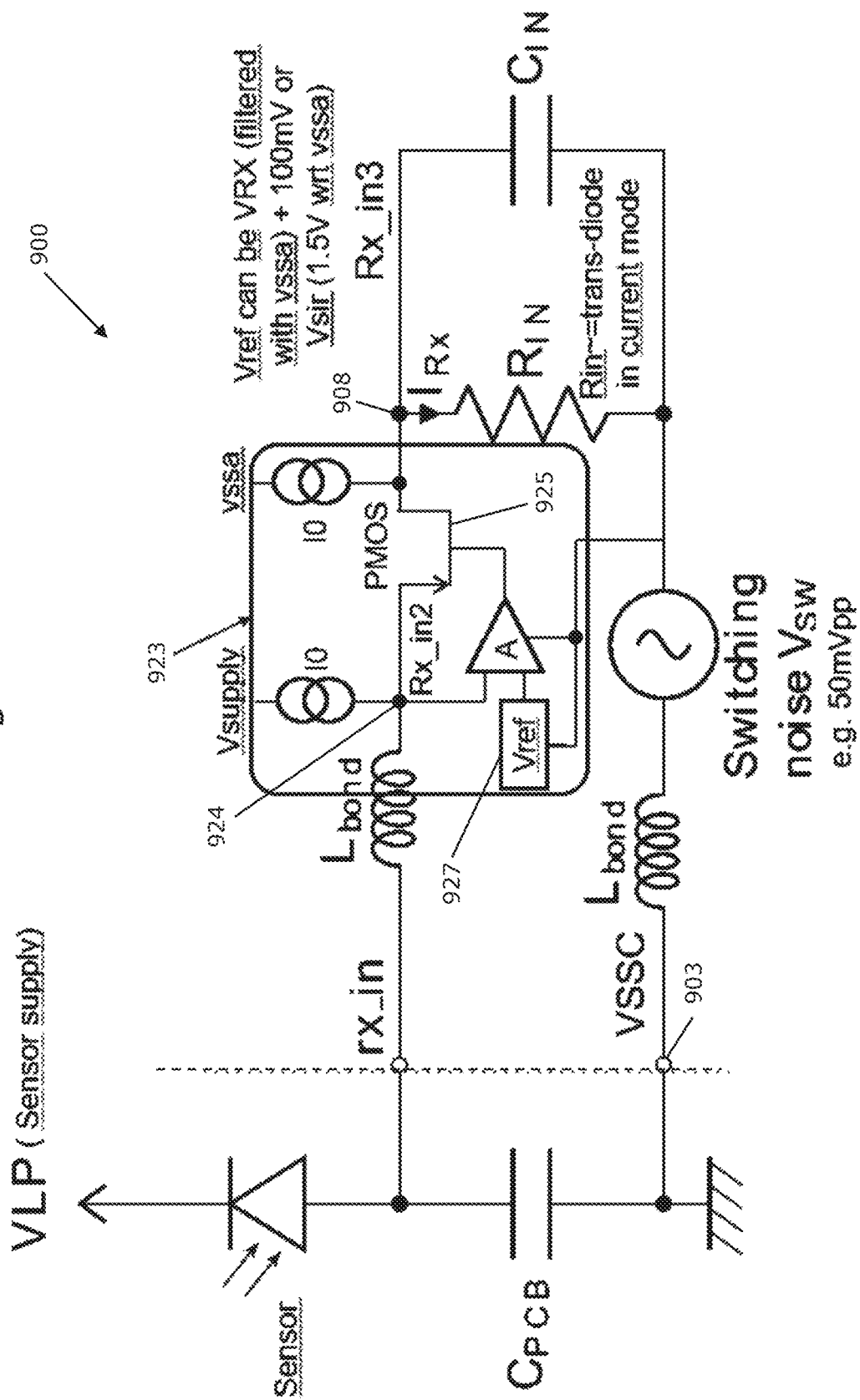
FIG. 9 illustrates a yet further example embodiment of a receiver circuit according to the present disclosure.

FIG. 9 illustrates a yet further example embodiment of a receiver circuit 900 according to the present disclosure. The receiver circuit of FIG. 9 is similar to the one of FIG. 5. Features of FIG. 9 that have already been described with reference to FIG. 5 will not necessarily be described again here.

In FIG. 9 the reference-voltage-source 927 is provided with respect to the voltage on the first-ground-pin, VSSC, 903. That is, the first-ground-pin, VSSC, 903 is the reference-pin for the reference-voltage-source 927 and also for the receiver circuit 900. In this way, the receiver circuit is configured to process a signal at the receiver-input-node 908 with respect to a voltage on the first-ground-pin, VSSC, 903.

The additional components 923 of FIG. 9 create the new low impedance node (the internal-node, Rx_in2, 924) that is connected to the sensor output and in this example is referenced to VSSC ground (the first-ground-pin 903). In some ICs, multiple ground pins do not exist and therefore it is beneficial that the additional components 923 of this example can function adequately using only one ground pin (the first-ground-pin 903) for all IC functions.

It will be appreciated that an NMOS MOSFET can be used instead of the PMOS MOSFET 925 that is shown in FIG. 9. This is in the same way that the NMOS MOSFET 825 of FIG. 8 can be used instead of the PMOS MOSFET 525 of FIG. 5.

Figure 10A:
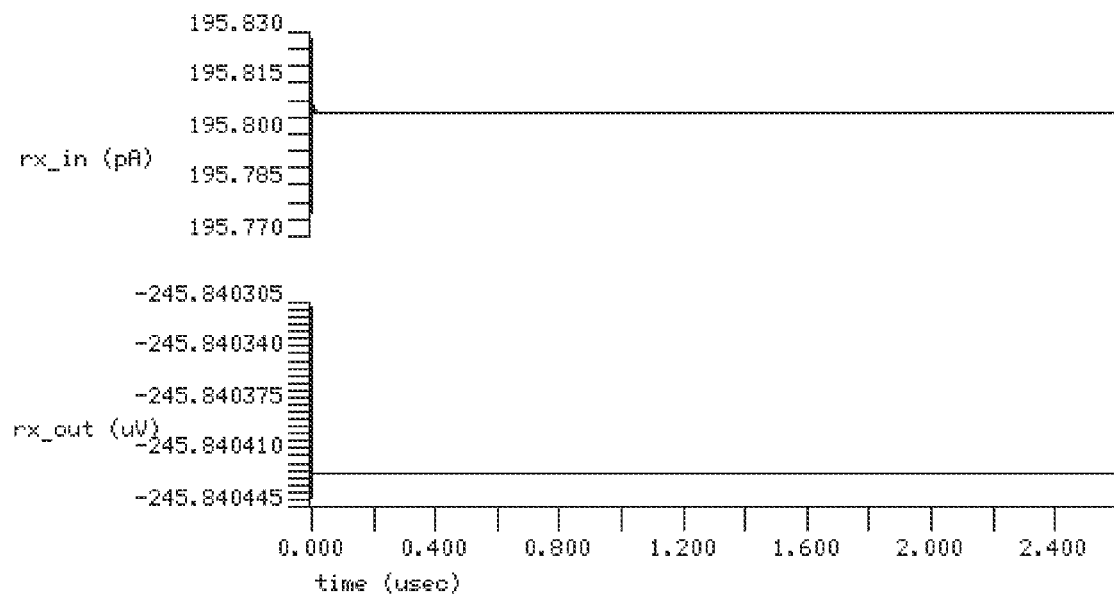
FIGS. 10*a* and 10*b* illustrate simulation results for the receiver circuit of FIG. 9, but without the switching noise voltage source, $V_{SW}$.
Figure 10B:
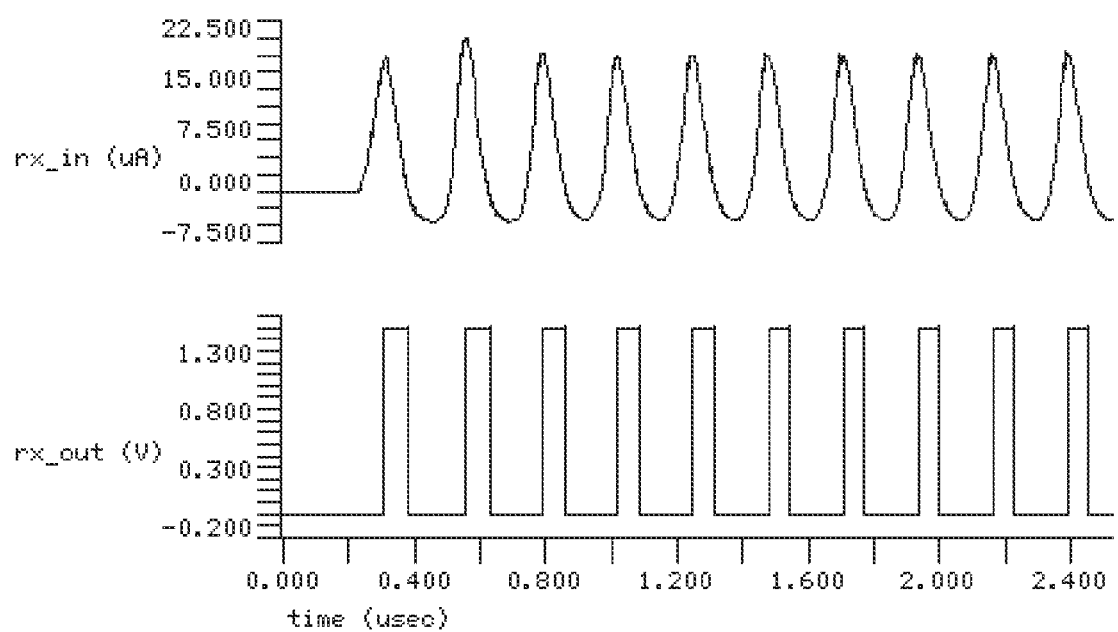

FIGS. 10a and 10b illustrate simulation results for the receiver circuit of FIG. 9, but without the switching noise voltage source, $V_{SW}$. FIGS. 10a and 10b are very similar to FIGS. 6a and 6b, and will not be described in any detail here.

Figure 11A:
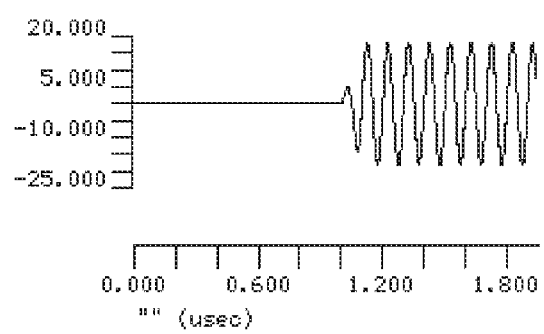
FIGS. 11*a*, 11*b* and 11*c* illustrate simulation results for the receiver circuit of FIG. 9 with the switching noise voltage source, $V_{SW}$.
Figure 11B:
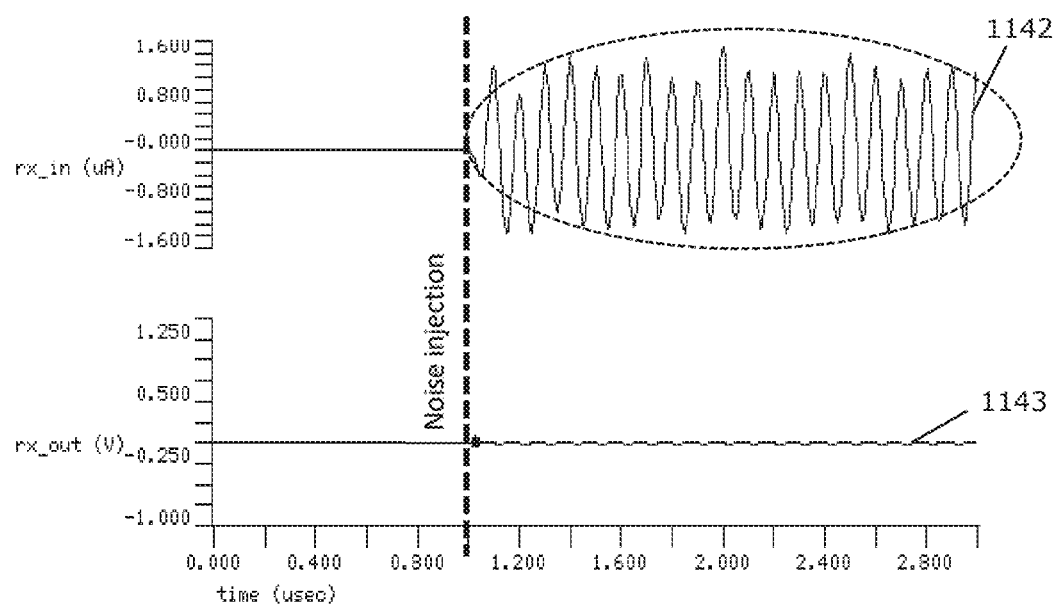
Figure 11C:
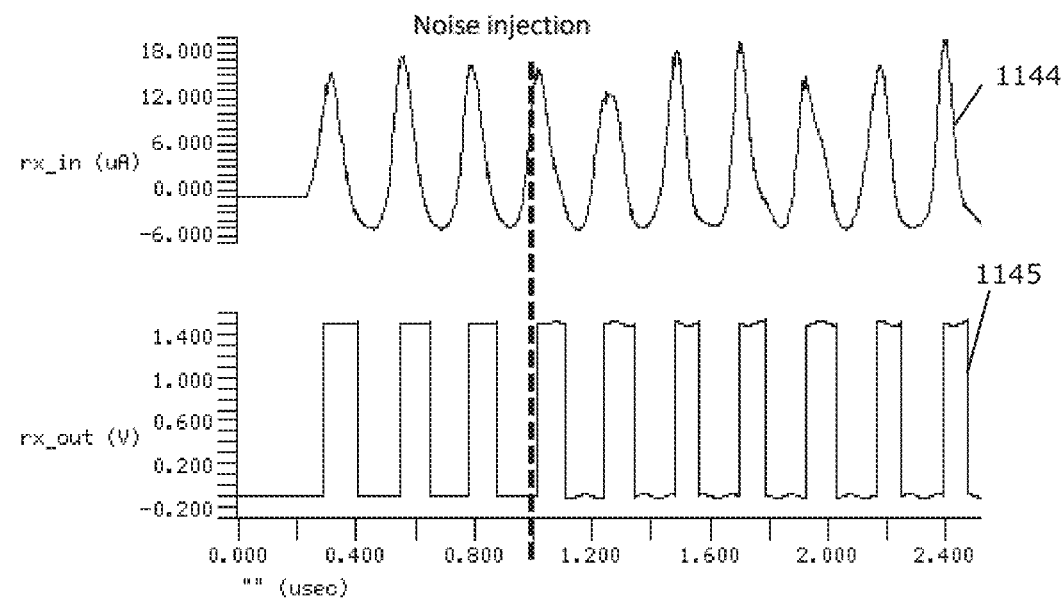

FIGS. 11a, 11b and 11c illustrate simulation results for the receiver circuit of FIG. 9 with the switching noise voltage source, $V_{SW}$. FIGS. 11a, 11b and 11c are very similar to FIGS. 7a, 7b and 7c.

It can be seen from FIG. 11b that the switching noise injected after 1 µs, as shown by the perturbation in rx_in 1142, does not have a significant impact on rx_out 1143.

It can be seen from FIG. 11c that the noise injected after 1 µs only very slightly degrades the quality of signal the input-pin, rx_in, 1144, which in turn slightly degrades the quality of the receiver-output-signal, rx_out, 1145. Nonetheless, the receiver-output-signal, rx_out, 1145 still represents good communication despite the small switching noise that was impacting the communication without the additional components of FIG. 5.

Examples disclosed herein include circuitry that is added in series between a current mode receiver input pin and receiver input stage (which can be a trans-diode connected MOS for current communication, but not limited to this) that allows the receiver to operate with noise on its ground (without generating an unintended signal on its output). This circuitry can artificially create a new low impedance node connected to the sensor output (Integrated Circuit: IC input pin) that is not modulated by IC internal ground noise used to ground the receiver. Therefore, the receiver input stage current is much less modulated by its ground noise, resulting in the processing of only the current signal generated by the external sensor (e.g. photo-diode). It can enable communication over longer distances between the emitter and receiver because the receiver input current detection threshold can be set to a lower level without the risk of detecting an unwanted noise signal.

The receivers of embodiments of the present disclosure can be current mode receivers, rather that voltage mode (that can include a high impedance differential amplifier). Therefore, applications that use a photo-diode as a sensor can be particularly well-suited to embodiments of the present disclosure because the useful information that is provided by the photo-diode is provided as a current. Such receivers of the present disclosure can provide good ground noise isolation and can also occupy relatively small areas on the die.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A receiver circuit comprising:
an input-pin;
a receiver-input-node;
a ground-pin;
an internal-node that is connected to the input-pin;
a MOSFET having:
a conduction channel connected in series between the internal-node and the receiver-input-node; and
a gate terminal, the voltage at which sets the conductivity of the conduction channel; and
an amplifier that:
has an input terminal that is connected to the internal-node; and
provides a voltage control signal to the gate terminal of the MOSFET such that the voltage at the internal-node with respect to the ground-pin is constant;
a first-current-source connected between a supply-voltage-terminal and one end of the conduction channel of the MOSFET; and
a second-current-source connected between a receiver circuit ground-pin and the other end of the conduction channel of the MOSFET.

2. The receiver circuit of claim 1, wherein the MOSFET is a PMOS MOSFET.

3. The receiver circuit of claim 1, wherein the MOSFET is an NMOS MOSFET.

4. The receiver circuit of claim 1, further including a reference-voltage-source that is configured to provide a reference voltage to another input terminal of the amplifier.

5. The receiver circuit of claim 4, wherein:
the receiver circuit includes a first-ground-pin and a second-ground-pin;
the receiver circuit is configured to process a signal at the receiver-input-node with respect to a voltage on the first-ground-pin; and
the reference-voltage-source is provided with respect to a voltage on the second-ground-pin.

6. The receiver circuit of claim 4, wherein:
the receiver circuit is configured to process a signal at the receiver-input-node with respect to a voltage on the ground-pin; and
the reference-voltage-source is provided with respect to a voltage on the ground-pin.

7. The receiver circuit of claim 1, wherein the receiver circuit ground pin is the ground pin.

8. The receiver circuit of claim 1, wherein:
the first-current-source is connected between the supply-voltage-terminal and the source of the MOSFET; and
the second-current-source is connected between the receiver circuit ground-pin and the drain of the MOSFET.

9. The receiver circuit of claim 1, wherein the internal-node is galvanically connected to the input-pin by a bond wire.

10. The receiver circuit of claim 1, wherein the input-pin is configured to receive a current signal from a sensor.

11. The receiver circuit of claim 10, wherein the sensor comprises a photo-diode.

12. An integrated circuit comprising the receiver circuit of claim 1.

13. A system comprising:
   the receiver circuit of claim 1 provided on an integrated circuit; and
   a sensor, which is external to the integrated circuit, wherein the sensor is configured to provide a current signal to the input-pin of the receiver circuit.

14. The system of claim 13, wherein the sensor comprises a photo-diode.

15. The system of claim 13, wherein the system is a battery management system.

16. The receiver circuit of claim 5, wherein the receiver circuit ground pin is the second-ground-pin.

17. The receiver circuit of claim 4, wherein the internal-node is galvanically connected to the input-pin by a bond wire.

18. The receiver circuit of claim 4, wherein the input-pin is configured to receive a current signal from a sensor.

19. A system comprising:
   the receiver circuit of claim 4 provided on an integrated circuit; and
   a sensor, which is external to the integrated circuit, wherein the sensor is configured to provide a current signal to the input-pin of the receiver circuit.

20. A receiver circuit comprising:
   an input-pin;
   a receiver-input-node;
   an internal-node that is connected to the input-pin;
   a MOSFET having:
      a conduction channel connected in series between the internal-node and the receiver-input-node; and
      a gate terminal, the voltage at which sets the conductivity of the conduction channel; and
   an amplifier that:
      has an input terminal that is connected to the internal-node; and
      provides a voltage control signal to the gate terminal of the MOSFET;
   a reference-voltage-source that is configured to provide a reference voltage to another input terminal of the amplifier;
   a first-current-source connected between a supply-voltage-terminal and one end of the conduction channel of the MOSFET; and
   a second-current-source connected between a receiver circuit ground-pin and the other end of the conduction channel of the MOSFET.

* * * * *